US010868471B2

(12) United States Patent
Fischer (10) Patent No.: US 10,868,471 B2
(45) Date of Patent: Dec. 15, 2020

(54) ADAPTIVE VOLTAGE MODIFICATION (AVM) CONTROLLER FOR MITIGATING POWER INTERRUPTIONS AT RADIO FREQUENCY (RF) ANTENNAS

(71) Applicant: T-Mobile USA, Inc., Bellevue, WA (US)

(72) Inventor: Steve Fischer, Windsor, CO (US)

(73) Assignee: T-MOBILE USA, INC., Bellevue, WA (US)

( * ) Notice: Subject to any disclaimer, the term of this patent is extended or adjusted under 35 U.S.C. 154(b) by 0 days.

(21) Appl. No.: 16/281,007

(22) Filed: Feb. 20, 2019

(65) Prior Publication Data

US 2019/0267694 A1   Aug. 29, 2019

Related U.S. Application Data

(60) Provisional application No. 62/634,674, filed on Feb. 23, 2018.

(51) Int. Cl.
*H02M 3/335* (2006.01)
*H01Q 1/00* (2006.01)
(Continued)

(52) U.S. Cl.
CPC .......... *H02M 3/335* (2013.01); *G01R 27/025* (2013.01); *G05F 1/62* (2013.01); *H01Q 1/002* (2013.01)

(58) Field of Classification Search
CPC ........ H01Q 1/002; G05F 1/62; G01R 27/025; G01R 19/2513; H02M 3/158;
(Continued)

(56) References Cited

U.S. PATENT DOCUMENTS 6,801,788 B1   10/2004  Csapo et al.
7,466,225 B2   12/2008  White et al.
(Continued)

FOREIGN PATENT DOCUMENTS

WO   2009143487 A2   11/2009
WO   2011115640 A1    9/2011

OTHER PUBLICATIONS

International Application No. PCT/US2019/022133, International Search Report and Written Opinion dated Jul. 2, 2019, 10 pages.
(Continued)

*Primary Examiner* — Kyle J Moody
(74) *Attorney, Agent, or Firm* — Han Santos, PLLC; Nabil A. Abdalla (57) ABSTRACT

This disclosure describes techniques to identify and mitigate an effect of a power interruption that impacts the operation of Radio Frequency (RF) antennas associated with a telecommunications network. More specifically, an Adaptive Voltage Modification (AVM) controller is described that is configured to monitor and detect a change in voltage that occurs during a power transmission from a Direct Current (DC) power source to a Remote Radio Unit (RRU). A power interruption may include a power disruption or a power surge. The AVM controller may be configured to cause a potential transformer that is coupled between the DC power source and the RRU to incrementally step-up or step-down the voltage of a power transmission from the DC power source. In this way, the AVM controller may preemptively mitigate an impact of a power interruption on Quality of Service (QoS) parameters associated with signal data transmitted by the RF antennas.

20 Claims, 7 Drawing Sheets

(51) Int. Cl.
*G01R 27/02* (2006.01)
*G05F 1/62* (2006.01)

(58) Field of Classification Search
CPC ............. H02M 3/156; H02M 3/33507; H02M 3/33523; H02M 3/335
See application file for complete search history.

(56) References Cited

U.S. PATENT DOCUMENTS

| | | | |
|---|---|---|---|
| 7,904,115 | B2 | 3/2011 | Hageman et al. |
| 8,547,164 | B2 | 10/2013 | Flores et al. |
| 9,281,866 | B2 | 3/2016 | Smentek et al. |
| 9,448,576 | B2 | 9/2016 | Chamberlain et al. |
| 9,472,956 | B2 | 10/2016 | Michaelis et al. |
| 9,485,723 | B2 | 11/2016 | Chakraborty et al. |
| 9,681,317 | B2 | 6/2017 | Carlin et al. |
| 9,759,880 | B2 | 9/2017 | Chamberlain et al. |
| 10,128,685 | B2 | 11/2018 | Hanley |
| 10,281,939 | B2 | 5/2019 | Chamberlain et al. |
| 10,470,120 | B2 * | 11/2019 | Fischer ................. H04W 52/22 |
| 2006/0182262 | A1 | 8/2006 | Goldman et al. |
| 2007/0093204 | A1 | 4/2007 | Kincard |
| 2011/0021186 | A1 | 1/2011 | Fischer |
| 2013/0031387 | A1 | 1/2013 | Whittam et al. |
| 2014/0378047 | A1 | 12/2014 | Kennard |
| 2015/0015078 | A1 | 1/2015 | Kim |
| 2015/0080055 | A1 | 3/2015 | Smentek et al. |
| 2015/0109710 | A1 | 4/2015 | Politis et al. |
| 2015/0168974 | A1 | 6/2015 | Mascarenhas et al. |
| 2015/0326317 | A1 | 11/2015 | Michaelis et al. |
| 2016/0316430 | A1 | 10/2016 | Fischer |
| 2018/0164355 | A1 | 6/2018 | Winkler et al. |
| 2018/0278054 | A1 * | 9/2018 | Johnson ................... G05F 5/00 |
| 2019/0268786 | A1 * | 8/2019 | Fischer .................. H02J 9/061 |

OTHER PUBLICATIONS

U.S. Appl. No. 16/194,200, Notice of Allowance dated Aug. 1, 2019, 27 pages.
U.S. Appl. No. 16/194,200, Notice of Allowance dated Apr. 25, 2019, 22 pages.
U.S. Appl. No. 16/281,019, Notice of Allowance dated May 5, 2020, 28 pages.

* cited by examiner

ADAPTIVE VOLTAGE MODIFICATION (AVM) CONTROLLER FOR MITIGATING POWER INTERRUPTIONS AT RADIO FREQUENCY (RF) ANTENNAS

RELATED APPLICATIONS

This application claims priority to a commonly owned U.S. Provisional Patent Application No. 62/634,674 filed on Feb. 23, 2018, and titled "Adaptive Voltage-boost Controller for Radio Frequency (RF) Antennas," which is herein incorporated by reference in its entirety.

BACKGROUND

The popularity of commercial wireless communication services (e.g. wireless telephony, wireless network access, and email services) has substantially increased during recent years. In many cases, users are increasingly relying on these services for both personal and business communications. Typically, telecommunications service providers rely on cell sites, such as base station nodes, to facilitate communications services and provide a reliable operation to their consumer base. However, at times, a cell site may unexpectedly experience power interruptions that impact a quality of communication services. Power interruptions may include power surges or power disruptions, albeit due to network congestion, or cell site hardware or software failures.

In some examples, a telecommunications service provider may be subject to significant financial expenditure as part of dealing with power interruptions, particularly when technicians are required to identify, mitigate, and/or repair the cause or effect of a power interruption.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

This disclosure describes techniques to identify and mitigate an effect of a power interruption at a Remote Radio Unit (RRU) that impacts the operation of Radio Frequency (RF) antennas associated with a telecommunications network. A power interruption (i.e. power surges or power disruptions) may occur for many reasons, such as a meteorological event or a base-station hardware or software failure. Furthermore, sending field teams to perform repairs on base station nodes (i.e. RRU) caused by power surges or power disruptions may be costly. Accordingly, this disclosure describes techniques for automatically compensating for power fluctuations at base station nodes may ensure a reliable operation of base stations nodes and the telecommunications network, as experienced by subscribers.

Accordingly, the present disclosure includes the deployment of an Adaptive Voltage Modificationjj (AVM) controller that is configured to monitor and detect a change in voltage that occurs during a power transmission from a Direct Current (DC) power source to an RRU. The AVM controller may transmit instructions to a potential transformer that is coupled between the DC power source and the RRU that causes the potential transformer to incrementally step-up (i.e. boost) or step-down (i.e. reduce) a power transmission from the DC power source to the RRU. In this way, the AVM controller may preemptively mitigate an impact that a power interruption may have on QoS parameters associated with signal data transmitted by the RF antennas.

In some examples, the AVM controller may use a look-up table to determine an anticipated voltage of a power transmission that is to be delivered to the RRU. The sensor(s) may be positioned proximate to the DC power source to measure voltage output from the DC power source. The sensor(s) may include a hall effect sensor that unobtrusively measures voltage in cables, however, any type of sensor that can measure voltage, obtrusively or unobtrusively, can be used. The AVM controller may use voltage compensation tables that correlate voltage output from the DC power source with voltage loss that is expected due to cable resistance along the cable length between the DC power source and the RRU. In this way, the AVM controller may quantify a voltage-boost of the voltage output from the DC power source that ensures that the voltage of the power transmission received at the RRU is within a predetermined voltage range In some examples, the predetermined voltage range may correspond to 50 volts to 57.5 volts, however any predetermined voltage range is possible. Further, a drop of voltage in a power transmission to the RRU that falls below the lower-limit of the predetermined voltage range (i.e. 50 volts) or a power surge that rises above the upper-limit (i.e. 57.5 volts), may similarly impact a Quality of Service (QoS) parameter associated with signal data (i.e. voice and data communications) transmitted by the RF antennas. The QoS parameters may relate to packet loss, latency, jitter, echo, downlink throughput, uplink throughput, or any combination thereof.

Moreover, the AVM controller may be further configured to determine, via sensor data analysis, the voltage of the power transmission at the RRU. In this example, sensor(s)

may be positioned proximate to the DC power source and the RRU to measure the voltage of a power transmission at each respective position. In doing so, the AVM controller may determine a voltage loss based on the difference between the voltage measured proximate to the DC power source and the RF antennas.

In a first non-limiting example, the AVM controller may determine, via a look-up table analysis or via sensory data analysis, that the voltage of the power transmission at the RRU is below a predetermined voltage threshold (i.e. below 50 volts). In doing so, the AVM controller may generate a voltage modification control signal for transmission to a potential transformer that causes the potential transformer to step-up the voltage of the power transmission to within the predetermined voltage range (i.e. 50 volts to 57.5 volts). In this way, the AVM controller may ensure that power transmissions to the RRU do not compromise an operation of the RF antennas, particularly the QoS parameters of voice and data communication signals transmitted by the RF antennas.

In a second non-limiting example, the AVM controller may determine, via a look-up table analysis or via sensory data analysis, that the voltage of the power transmission received at the RRU is expected to be greater than the predetermined voltage range (i.e. above 57.5 volts). In this example, the AVM controller may generate a voltage modification control signal for transmission to the potential transformer that causes the potential transformer to step-down the voltage of the power transmission to within the predetermined voltage range (i.e. 50 volts to 57.5 volts). In this way, the AVM controller can ensure that base-station hardware and software elements are not compromised due to a power surge.

In various examples, the AVM controller may be configured to generate a voltage-boost based at least in part on factors other than voltage loss that occurs between the DC power source and the RRU. For example, the AVM controller may capture current environmental metadata that impacts an operation of the RF antennas, and in doing so, determine whether to impose a voltage modification to power transmissions delivered to the RRU. The current environmental metadata may correspond to periodic sampling of network congestion, network impediments (i.e. hardware or software-based), DC power source impediments, or an indication of current or forecast meteorological events. In some examples, the current environmental metadata may further include QoS parameters associated with the RF antennas, such as data packet loss, data latency, jitter, echo, downlink throughput, uplink throughout, or any combination thereof. The current environmental metadata may be sourced from the DC power source, potential transformer, baseband unit, RRU, RF antennas, an enterprise server of the telecommunications network, or a trusted third-party server affiliated with, or accessible by, the AVM controller.

In this example, the AVM controller may quantify the voltage-boost based at least in part on the current environmental metadata. For example, the AVM controller may retrieve historical instances of voltage-boost that occur in response to historical environmental metadata, such as network congestion, network (i.e. hardware or software) impediments, DC power source impediments, or meteorological events. Meteorological events may include weather events, such as electrical storms, that impede the transmission of signal data (i.e. voice and data communications) by the RF antennas.

The AVM controller may use one or more trained machine learning algorithms to correlate current environmental metadata with historical environmental metadata to quantify a voltage-boost that is required to maintain a threshold QoS for signal data (i.e. voice and data communications) transmitted by the RF antennas. The one or more trained machine learning algorithms may make use of techniques such as supervised learning, unsupervised learning, semi-supervised learning, naive Bayes, Bayesian networks, decision trees, neural networks, fuzzy logic models, and/or probabilistic classification models.

In various examples, the AVM controller may generate an analysis model associated with power transmissions from the DC power source to the RRU over a predetermined time interval. The predetermined time interval may be 30 days, six months, one year, or five years, however, any predetermined time interval is possible. The analysis model may be developed based at least in part on historical power transmission data. The historical power transmission data may include indications of the voltage output from the DC power source, voltage loss that occurs during power transmissions to the RRU, the voltage of power transmissions at the RRU, corresponding QoS parameters associated with signal data transmitted by the RF antennas, or any combination thereof. The QoS parameters may relate to data packet loss, data latency, jitter, echo, downlink throughput, uplink throughout, or any combination thereof.

The analysis model may further correlate historical power transmission data with corresponding historical instances of environmental metadata. In this way, the analysis model may provide the AVM controller with a platform to infer a voltage modification based at least in part on a correlation of current environmental metadata and historical environmental metadata that is represented within the analysis model. Stated another way, the analysis model may receive an input of current environmental metadata and output an inferred voltage modification that is most similar to past events (i.e. historical instances of environmental data).

Consider a non-limiting example, whereby the AVM controller analyzes current environmental metadata associated with a DC power source and RRU, and in doing so, identifies an occurrence of a meteorological event. The AVM controller may further use one or more trained machine learning algorithms to correlate the current environmental metadata with data-points of the analysis model and infer that a voltage-boost is likely required to ensure that the QoS parameters associated with signal data (i.e. voice and data communications) transmitted by the RF antennas is not compromised by the meteorological event.

In another non-limiting example, the AVM controller may analyze current environmental metadata to predict an impending network congestion. For example, the current environmental metadata may include a current time of day or a current day of the week. The AVM controller may further use one or more trained machine learning algorithms to correlate the current environmental metadata with data-points of the analysis model to infer that a voltage-boost is likely required to overcome the impending network congestion. It is noteworthy that the historical environmental metadata used to develop the analysis model may include corresponding times of the day or current days of the week.

In various examples, the AVM controller may preemptively initiate a voltage-boost at a point-in-time prior to an impending network congestion or meteorological event. For example, the AVM controller may identify a step-up voltage rate that is associated with a potential transformer that is coupled between the DC power source and the RRU. The step-up voltage rate may correspond to an incremental voltage-boost that occurs over a one-minute time interval.

The step-up voltage rate may be one volt-per-minute, two volts-per-minute, however, any step-up voltage rate is possible.

In doing so, the AVM controller may further determine a voltage-boost reaction time that is required to implement a determined voltage-boost, based at least in part on the voltage step-up rate of the potential transformer. For example, consider a voltage-boost of five volts and a step-up voltage rate of 0.5 volts-per-minute. In this example, the voltage-boost reaction time corresponds to ten minutes.

Thus, the AVM controller may cause the potential transformer to initiate the voltage-boost at a point-in-time that occurs prior to the inferred network congestion or meteorological event by a time interval equal to or greater than the voltage-boost reaction time. Continuing with the previous example, the AVM controller may initiate the voltage-boost to occur at least ten minutes prior to the inferred network congestion or meteorological event.

In other examples, the AVM controller may preemptively initiate a voltage-reduction at a point-in-time prior to an inferred power surge. The AVM controller may infer a power surge based on a correlation of current environmental metadata with data-points of an analysis model. The analysis model may include historical instances of power surges along with corresponding historical environmental metadata. The AVM controller may identify a step-down voltage rate for a potential transformer that is coupled between the DC power source and the RRU. The step-down voltage rate may correspond to an incremental voltage-reduction that occurs over a one-minute time interval. The step-down voltage rate may be one volt-per-minute, two volts-per-minute, however, any step-down voltage rate is possible.

In doing so, the AVM controller may further determine a voltage-reduction reaction time that is required to implement a determined voltage-reduction, based at least in part on the voltage step-down rate of the potential transformer. Thus, the AVM controller may cause the potential transformer to initiate the voltage-reduction at a point-in-time that occurs prior to the inferred power surge by a time interval equal to or greater than the voltage-reduction reaction time.

In a non-limiting example, an AVM controller may infer that a power surge is likely to occur within a predetermined time interval, such as ten minutes. The AVM controller may further determine that the voltage-reduction reaction time associated with the potential transformer is greater than the predetermined time interval (i.e. ten minutes), based at least in part on the step-down voltage rate of the potential transformer. In the event that the AVM controller determines that it is unable to implement the voltage-reduction before the power surge occurs, the AVM controller may transmit a power cut-off control signal to the DC power source that causes the DC power source to cease power transmissions. In doing so, the AVM controller may protect the hardware and software elements of the RF antennas (i.e. baseband unit and RRU) from the impact of the power surge.

Further, the term "techniques," as used herein, may refer to system(s), method(s), computer-readable instruction(s), module(s), algorithms, hardware logic, and/or operation(s) as permitted by the context described above and throughout the document.

Figure 1:
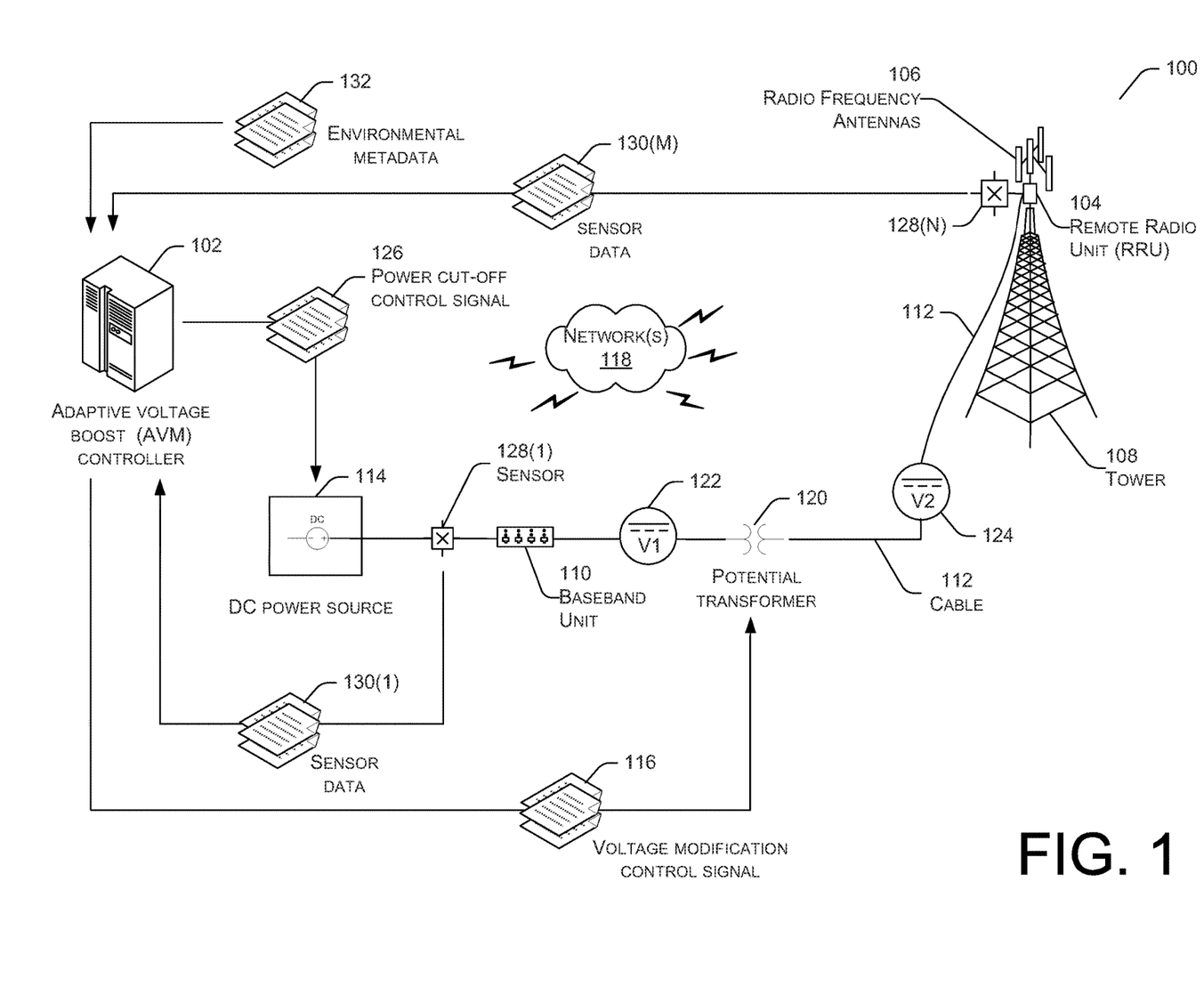
FIG. 1 illustrates an example architecture of an Adaptive Voltage Modification (AVM) controller that is configured to mitigate an effect of a power interruption that impacts a Remote Radio Unit (RRU) and the operation of Radio Frequency (RF) antennas.

FIG. 1 illustrates an example architecture of an Adaptive Voltage Modification (AVM) controller 102 that is configured to mitigate an effect of a power interruption that impacts a Remote Radio Unit (RRU) 104 and the operation of Radio Frequency (RF) antennas 106. A power interruption may correspond to a power disruption or a power surge, albeit due to network congestion, meteorological events, or a base-station hardware or software failure.

In the illustrated example, the one or more RF antennas 106 may be located at or near the top of a tower 108. A radio and transceiver may be located at the top of the tower 108 and are typically referred to as a remote radio unit (RRU) 104. The RRU 104 may also be referred to as a remote radio head (RRH). An RRU 104 may significantly improve the quality of the cellular data signals that are transmitted and received by the one or more RF antennas 106 through a reduction in signal transmission losses and noise.

The RRU 104 may be configured to receive digital information and control signals from a baseband unit 110 and further modulate this information into a radio frequency (RF) signal that is then transmitted through the one or more RF antennas 106. The RRU 104 may also receive RF signals from the one or more RF antennas 106, demodulate the RF signals, and supply the demodulated signals to the baseband unit 110.

The baseband unit 110 may be configured to process the demodulated signals received from the RRU 104 into a format suitable for transmission over a backhaul communication system of a telecommunications network. The baseband unit 110 may also process signals received from the backhaul communication system and supplies the processed signals to the RRU 104 for modulation into RF signals.

In one example, the RRU 104 may be located at the top of the tower 108 to reduce the signal loss between the RRU 104 and the one or more RF antennas 106. For example, if the RRU 104 were located at the bottom of the tower 108, a cable 112 must extend up the tower to the one or more RF antennas 106, a distance of 100 to 200 feet or more, causing appreciable signal loss in transmission signals at cellular frequencies (e.g. 1.8 GHz 3.0 GHz, etc.) over the cable 112. The signal loss may be somewhat mitigated by locating the RRU 104 at the top of the tower 108 near the one or more RF antennas 106, which reduces the required length of the cable 112.

In some examples, the baseband unit 110 may be located at the bottom of the tower 108. Note that signal loss in the cabling connection between the baseband unit 110 at the bottom of the tower 108 and the RRU 104 at the top of the tower 108 may be much smaller, as compared to the signal loss associated with locating the RRU 104 at the bottom of the tower 108, because these signals between the baseband unit 110 and the RRU 104 are transmitted at baseband frequencies as opposed to RF frequencies.

In the illustrated example, a DC power source 114 may generate a suitable direct current ("DC") power signal for powering the baseband unit 110 and the RRU 104. The RRU 104 is often powered by a (nominal) 48 Volt DC power supply in cellular systems that are currently in use today. However, as mentioned above, the RRU 104 is typically located at or near the top of the tower 108, whereas the DC power source 114 is located within an enclosure at or near the base of the tower 108. Accordingly, the power generated by the DC power source 114 may be routed up the tower 108 for a significant distance. In the illustrated example, the power is delivered up the tower 108 to the RRU 104 via a cable 112. The cable 112 may be a hybrid connector system (HCS) cable that combines fiber communications (i.e. fiber optic cable connected to the baseband unit 110) and the DC power into a single cable.

Due to a variety of factors, such as cable run distance, load, and environment (e.g. temperature), the power transmitted over the cable 112 may experience a voltage loss or a voltage surge. Accordingly, an AVM controller 102 may be configured to monitor the voltage output from the DC power source 114 at various locations between the DC power source 114 and the RRU 104. Further, the AVM controller 102 may transmit a voltage modification control signal 116, via one or more network(s) 118, to a potential transformer 120 located between the DC power source 114 and RRU 104. The potential transformer 120 may be configured to step-up or step-down the voltage of a power transmission from the DC power source 114, based at least in part on the voltage modification control signal 116.

Each voltage modification control signal 116 may cause the potential transformer 120 to modify the voltage of a power transmission from the DC power source 114 at a given point-in-time, at a predetermined step-up or step-down rate, and by a predetermined voltage amount.

The rate at which the potential transformer 120 may step-up or step-down the voltage of a power transmission may be based on a voltage step-up rate or a voltage step-down rate, that is set by an operator of the AVM controller 102 or an administrator of the telecommunications network. Alternatively, the voltage step-up rate or voltage step-down rate may be based on performance characteristics of the potential transformer 120.

In one example, the AVM controller 102 may transmit a voltage modification control signal 116 to the potential transformer 120 that causes the potential transformer 120 to modify a first voltage 122 of a power transmission transmitted from the DC power source 114 to a second voltage 124 that is delivered to the RRU 104. The voltage modification control signal 116 may cause the potential transformer 120 to initiate a voltage-boost (i.e. second voltage 124 is greater than first voltage 122) in the power transmission to the RRU 104. Alternatively, the voltage modification control signal 116 may cause the potential transformer 120 to initiate a voltage-reduction (i.e. second voltage 124 is less than first voltage 122) in the power transmission to the RRU 104.

Additionally, or alternatively, the AVM controller 102 may transmit a power cut-off control signal 126 to the DC power source 114 that causes the DC power source 114 to cease power transmissions to the RRU 104. In doing so, the AVM controller 102 may protect the RRU 104 and one or more RF antennas 106 from a detected or inferred power surge.

Additionally, the AVM controller 102 may be communicatively coupled to one or more sensor(s) 128(1)-128(N) via one or more network(s) 118. The one or more sensor(s) 128(1)-128(N) may be positioned at various locations along the cable 112 including adjacent to the DC power source 114, the potential transformer 120, and the RRU 104. The one or more sensor(s) 128(1)-128(N) may include hall effect sensors that unobtrusively measure the voltage of power transmissions in the cable 112. However, any type of sensor that can measure the voltage of power transmissions may be used.

In some examples, the AVM controller 102 may monitor and analyze sensor data 130(1)-130(M) from the one or more sensor(s) 128(1)-128(N) to quantify voltage loss that occurs during a power transmission from the DC power source 114 to the RRU 104. In other examples, the AVM controller 102 may infer voltage loss at the RRU 104 based on a combination of sensor data 130(1)-130(M) and empirical data accessible by the AVM controller 102. For purposes of clarity, FIG. 1 illustrates the AVM controller 102 retrieving sensor data 130(1) and 130(M) from sensors 128(1) and 128(N) adjacent to the DC power source 114 and the RRU 104, respectively. However, sensor data 130(1)-130(M) may be retrieved from any one of the one or more sensor(s) 128(1)-128(N).

Moreover, the AVM controller 102 may capture current environmental metadata that impacts an operation of the RF antennas 106 to determine whether to impose a voltage modification to power transmissions delivered to the RRU 104. The current environmental metadata 132 may include periodic samplings of network congestion, network impediments (i.e. hardware or software-based), DC power source impediments, meteorological events, or any combination thereof. The current environmental metadata 132 may also include a calculation of, or pertinent data used to calculate, current QoS parameters associated with signal data (i.e. voice and data communications) transmitted by the RF antennas. The AVM controller 102 may retrieve the current environmental metadata 132 from the DC power source 114, potential transformer 120, baseband unit 110, RRU 104, the RF antennas 106, enterprise servers associated with a telecommunications network, or other trusted third-party servers affiliated with, or accessible by the AVM controller 102, via the one or more network(s) 118.

In various examples, the AVM controller 102 may operate on one or more distributed computing resource(s). The one or more distributed computing resource(s) may include one or more computing device(s) that operate in a cluster or other configuration to share resources, balance load, increase performance, provide fail-over support or redundancy, or for other purposes. The one or more computing device(s) may include one or more interfaces to enable communications with other networked devices via one or more network(s) 118.

Moreover, the one or more network(s) 118 may include public networks such as the Internet, private networks such as an institutional and/or personal intranet, or some combination of private and public networks. The one or more network(s) can also include any type of wired and/or wireless network, including but not limited to local area network (LANs), wide area networks (WANs), satellite networks, cable networks, Wi-Fi networks, Wi-Max networks, mobile communications networks (e.g. 3G, 4G, and so forth), or any combination thereof.

Figure 2:
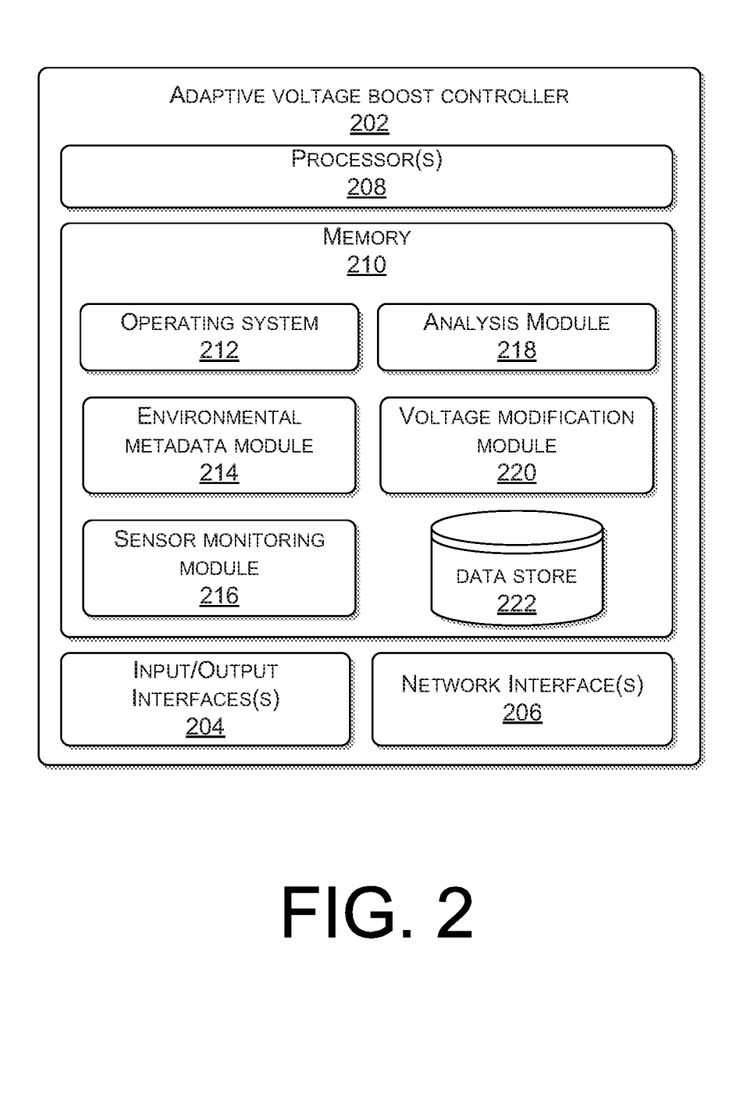
FIG. 2 illustrates a block diagram of various components of an AVM controller.

FIG. 2 illustrates a block diagram of various components of an Adaptive Voltage Modification (AVM) controller. The AVM controller 202 may include routines, program instructions, objects, and/or data structures that perform particular tasks or implement abstract data types. Further, the AVM controller 202 may include input/output interface(s) 204. The input/output interface(s) 204 may include any type of output interface known in the art, such as a display (e.g. a liquid crystal display), speakers, a vibrating mechanism, or a tactile feedback mechanism. Input/output interface(s) 204 also include ports for one or more peripheral devices, such as headphones, peripheral speakers, or a peripheral display. Further, the input/output interface(s) 204 may further include a camera, a microphone, a keyboard/keypad, or a touch-sensitive display. A keyboard/keypad may be a push button numerical dialing pad (such as on a typical telecommunication device), a multi-key keyboard (such as a conventional QWERTY keyboard), or one or more other types of keys or buttons, and may also include a joystick-like controller and/or designated navigation buttons, or the like.

Additionally, the AVM controller 202 may include the network interface(s) 206. The network interface(s) 206 may include any sort of transceiver known in the art. For example, the network interface(s) 206 may include a radio transceiver that performs the function of transmitting and receiving radio frequency communications via an antenna. In addition, the network interface(s) 206 may also include a wireless communication transceiver and a near-field antenna for communicating over unlicensed wireless Internet Protocol (IP) networks, such as local wireless data networks and personal area networks (e.g. Bluetooth or near field communication (NFC) networks). Further, the network interface(s) 206 may include wired communication components, such as an Ethernet port or a Universal Serial Bus (USB).

Further, the AVM controller 202 may include one or more processor(s) 208 that are operably connected to memory 210. In at least one example, the one or more processor(s) 208 may be a central processing unit(s) (CPU), graphics processing unit(s) (GPU), or both a CPU and GPU or any other sort of processing unit(s). Each of the one or more processor(s) 208 may have numerous arithmetic logic units (ALUs) that perform arithmetic and logical operations as well as one or more control units (CUs) that extract instructions and stored content from processor cache memory, and then executes these instructions by calling on the ALUs, as necessary during program execution. The one or more processor(s) 208 may also be responsible for executing all computer applications stored in the memory, which can be associated with common types of volatile (RAM) and/or non-volatile (ROM) memory.

In some examples, memory 210 may include system memory, which may be volatile (such as RAM), non-volatile (such as ROM, flash memory, etc.) or some combination of the two. The memory may also include additional data storage devices (removable and/or non-removable) such as, for example, magnetic disks, optical disks, or tape.

The memory 210 may further include non-transitory computer-readable media, such as volatile and nonvolatile, removable and non-removable media implemented in any method or technology for storage of information, such as computer-readable instructions, data structures, program modules, or other data. System memory, removable storage, and non-removable storage are all examples of non-transitory computer-readable media. Examples of non-transitory computer-readable media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transitory medium which can be used to store the desired information.

In the illustrated example, the memory 210 may include an operating system 212, an environmental metadata module 214, a sensor monitoring module 216, the analysis module 218, voltage modification module 220, and a data store 222. The operating system 212 may be any operating system capable of managing computer hardware and software resources.

The environmental metadata module 214 may be configured to capture environmental metadata that impacts an operation of the RF antennas. The environmental metadata may include periodic samples of network congestion, network impediments (i.e. hardware or software-based), DC power source impediments, meteorological events, or any combination thereof. The environmental metadata may further include a calculation of, or pertinent data used to calculate, QoS parameters associated signal data (i.e. voice and data communications) transmitted by the RF antennas. The QoS parameters may relate to data packet loss, data latency, jitter, echo, downlink throughput, uplink throughout, or any combination thereof. The environmental metadata module 214 may capture the environmental metadata from the DC power source, the potential transformer, the baseband unit, the RRU, the RF antennas, enterprise servers associated with the telecommunications network, or a trusted third-party server affiliated with, or accessible by, the AVM controller.

The sensor monitoring module 216 may be configured to monitor and retrieve sensor data from one or more sensor(s) positioned between the DC power source, potential transformer, the baseband unit, the RRU, and the RF antennas. The sensor data may indicate the voltage of a power transmission at each discrete sensor location. The sensor monitoring module 216 may monitor and retrieve sensor data from each, or a select number of sensor(s), on a continuous basis, per a predetermined schedule, or in response to a triggering event. The predetermined schedule may be based on a time interval of one hour, six hours, or 12 hours. Any time interval is possible. Further, the triggering event may be based on current environmental metadata that indicates network congestion, network impediments, or a current or forecast meteorological event. The triggering event may also correspond to receipt of an indication that at least one QoS parameter associated with signal data transmitted by the RF antennas has fallen below a predetermined QoS threshold. The predetermined QoS threshold may be set by an operator of the AVM controller or an administrator of the telecommunications network.

The analysis module 218 may be configured to analyze sensor data and determine whether to initiate a voltage-boost or a voltage-reduction to a power transmission from the DC power source to the RRU. In one example, the analysis module 218 may determine a voltage boost that is required to mitigate a voltage loss that occurs during a power transmission from the DC power source to the RRU. The analysis module 218 may quantify the voltage loss based on a combination of sensor data at the DC power source, the RRU, and/or the RF antennas. Alternatively, the voltage loss may be based on a combination of sensor data at the DC power source and empirical data. Empirical data may include voltage compensation tables that correlate voltage output from a DC power source with voltage loss that is expected to occur along the cable length between the DC power source and the RRU.

The analysis module 218 may further generate an analysis model by correlating historical power transmission data with corresponding historical instances of environmental metadata. The analysis module 218 may continuously evaluate historical power transmission data and historical environmental metadata to progressively refine the analysis model. As more historical power transmission data and historical environmental metadata becomes available, a continuously more accurate analysis model can be developed.

Moreover, the analysis module 218 may employ one or more trained machine learning algorithms to determine a similarity between the current environmental metadata and data-points of the analysis model. In doing so, the analysis module 218 may infer the occurrence of a power interruption event based at least in part on the similarity being greater than or equal to a predetermined similarity threshold. The similarity may be determined by measuring the Euclid distance between the current environmental metadata and data-points of the analysis model.

The voltage modification module 220 may be configured to generate and deploy a voltage modification control signal to the potential transformer to initiate a voltage boost. In this example, the voltage modification module 220 may determine a voltage-boost reaction time, which quantifies an amount of time that is required to implement a voltage-boost determined by the analysis module 218. The voltage-boost reaction time may be further based at least in part on the voltage step-up rate associated with the potential transformer.

In this example, the voltage modification control signal may cause the potential transformer to initiate the voltage-boost at the potential transformer. In some examples, the voltage modification control signal may be configured to initiate the voltage-boost at a point-in-time that occurs prior to an inferred power interruption event by a time interval equal to or greater than the voltage-boost reaction time.

Alternatively, the voltage modification module 220 may be configured to generate and deploy a voltage modification control signal to the potential transformer to initiate a voltage reduction. In this example, the voltage modification module 220 may determine a voltage-reduction reaction time, which quantifies an amount of time that is required to implement a voltage-reduction determined by the analysis module 218. The voltage-reduction reaction time may be further based at least in part on the voltage step-down rate associated with the potential transformer.

In this example, the voltage modification control signal may cause the potential transformer to initiate the voltage-reduction at the potential transformer. In one non-limiting example, the voltage modification module 220 may include further instructions that initiate the voltage-reduction at a point-in-time prior to an inferred power surge event. The point-in-time may precede the inferred power surge event by a time interval that is equal to or greater than the voltage-reduction reaction time.

Alternatively, the voltage modification module 220 may determine that a voltage-reduction reaction time is greater than an impending time interval before an inferred power surge is likely to occur. In doing so, the voltage modification module 220 may generate and deploy a power cut-off control signal to the DC power source to cease power transmissions to the RRU.

The data store 222 may be configured to store historical environmental metadata, historical power transmission data, potential transformer step-up rates, step-down rates, and QoS parameters associated with signal data transmitted by the RF antennas. The data store 222 may further include a record of empirical data used to perform a voltage modification analysis.

FIGS. 3 through 7 present processes 300 through 700 that relate to operations of the AVM controller. Each of processes 300 through 700 illustrate a collection of blocks in a logical flow chart, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or in parallel to implement the process. For discussion purposes, the processes 300 through 700 are described with reference to the example architecture 100 of FIG. 1.

Figure 3:
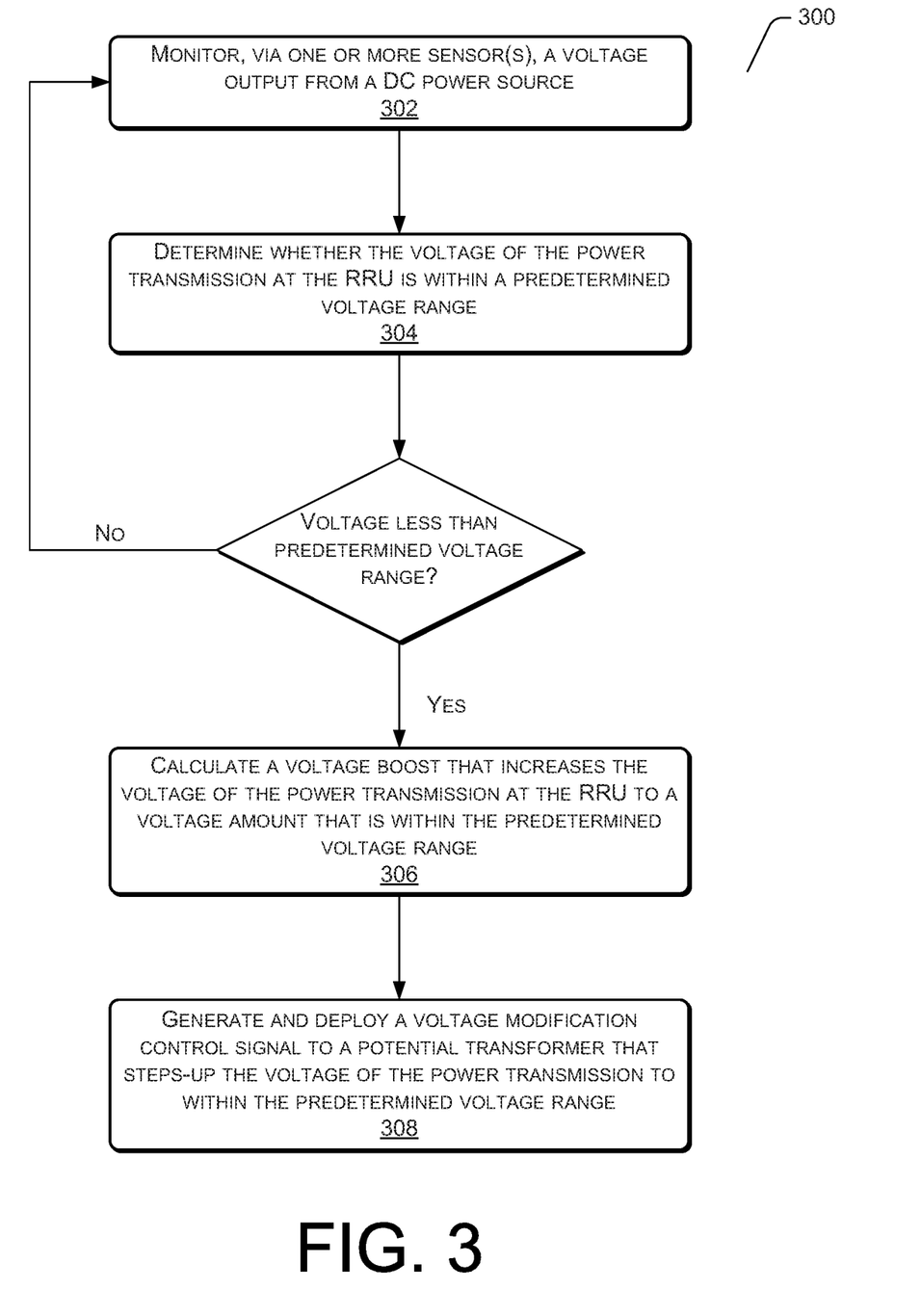
FIG. 3 illustrates an AVM controller process for performing an analysis of sensor data to quantify a voltage-boost to increase the voltage of a power transmission received at a Remote Radio Unit (RRU).

FIG. 3 illustrates an AVM controller process for performing an analysis of sensor data to quantify a voltage-boost to increase the voltage of a power transmission received at a Remote Radio Unit (RRU). The voltage-boost may be intended to mitigate at least a portion of voltage loss that occurs during a power transmission from a DC power source to the RRU. In various example, the voltage loss may be due to the electrical resistance of cables between the DC power source and the RRU.

At 302, the AVM controller may monitor, via one or more sensor(s), a voltage output from a DC power source. The one or more sensors may include hall effect sensors positioned at various discrete points between the DC power source and RRU. In one example, the one or more sensor(s) may be proximate to the DC power source to measure a corresponding voltage of a power transmission. Additionally, or alternatively, the one or more sensor(s) may be positioned downstream of the DC power source to measure a voltage of the power transmission at the potential transformer, the baseband unit, the RRU, the RF antennas, or any combination thereof. In this latter example, the voltage loss that occurs during power transmission between the DC power source and the RRU may be based on the voltages measured at the DC power source and the RRU.

At 304, the AVM controller may determine whether the voltage of the power transmission at the RRU is within a predetermined voltage range. The predetermined voltage range may correspond to a voltage range required to maintain a QoS in voice and data communications via the RF antennas.

At 306, the AVM controller may determine that the voltage of the power transmission at the RRU is less than the predetermined voltage range. In other words, the AVM controller may determine that the voltage of the power transmission at the RRU is too low to maintain the requisite QoS in voice and data communications via the RF antennas.

In doing so, the AVM controller may calcuate a voltage-boost that increases the voltage of the power transmission at the RRU to a voltage amount that is within the predetermined voltage range. In this example, the voltage-boost is intended to mitigate, at least a portion of, the voltage loss associated with the delivery of the power transmission from the DC power source to the RRU.

Alternatively, the AVM controller may determine that the voltage at the RRU is within the predetermined voltage range. Stated another way, the AVM controller may determine that the voltage of the power transmission at the RRU can adequately maintain a requisite QoS in voice and data communications via the RF antennas. Thus, process 300 may return to step 302, and the AVM controller may continue to monitor, via one or more sensor(s), the voltage output from the DC power source.

At 308, the AVM controller may generate and deploy a voltage modification control signal to a potential transformer that causes the potential transformer to step-up a voltage of the power transmission at the potential transformer to a voltage amount that is within the predetermined voltage range. In doing so, by including the voltage-boost, the AVM controller, by design, can ensure that the RRU can operate without compromising the QoS parameters in voice and data communications via the RF antennas.

Figure 4:
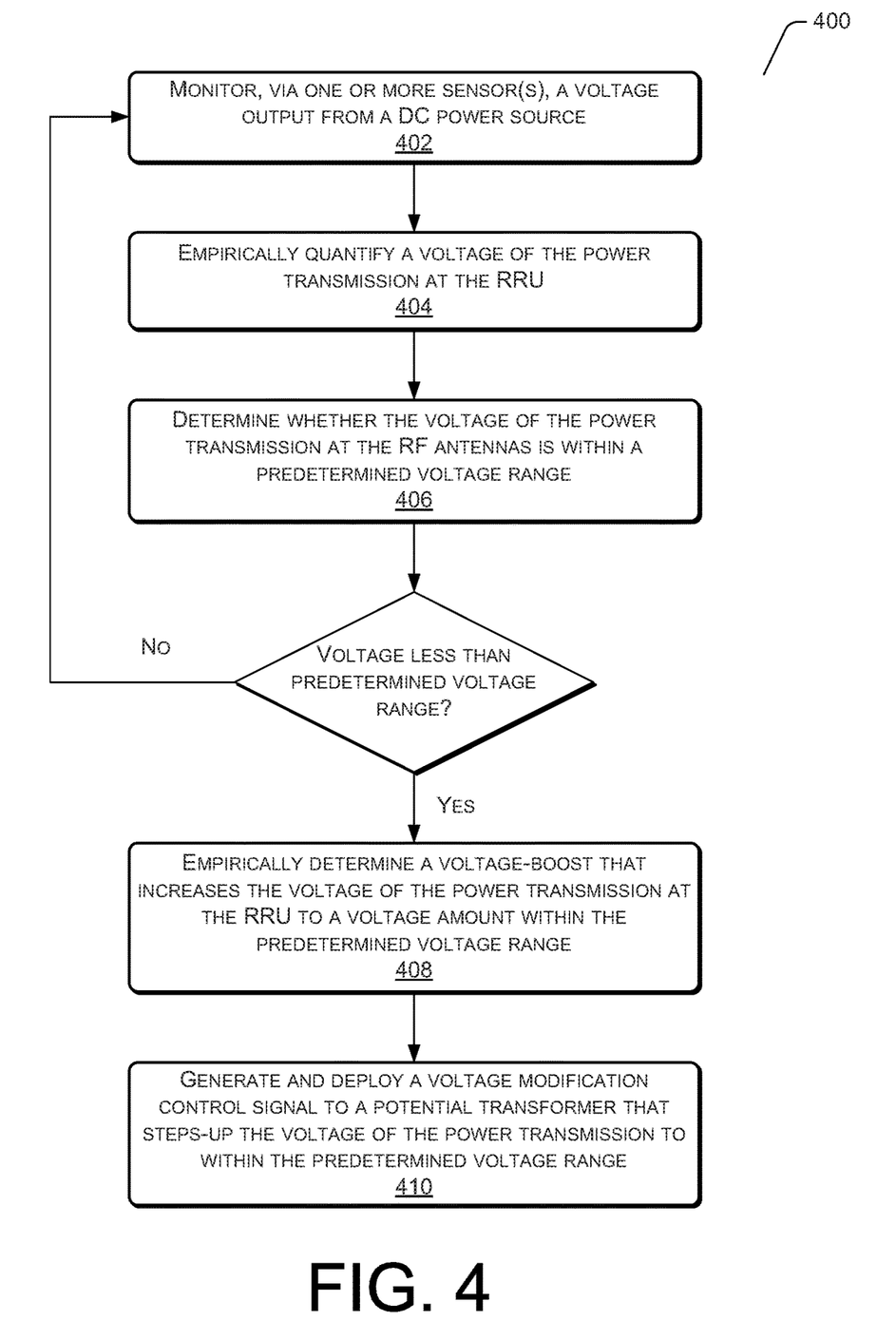
FIG. 4 illustrates an AVM controller process for performing an analysis using voltage compensation tables to quantify a voltage-boost to increase the voltage of a power transmission received at a Remote Radio Unit (RRU).

FIG. 4 illustrates an AVM controller process for performing an analysis using voltage compensation tables to quantify a voltage-boost to increase the voltage of a power transmission received at a Remote Radio Unit (RRU). Voltage compensation tables may correlate voltage output from a DC power source with voltage loss that is expected due to cable resistance along the length of cables between the DC power source and the RRU. It is noteworthy that the voltage loss is directly proportional to the length of the cables.

At 402, the AVM controller may monitor, via one or more sensor(s), a voltage output from a DC power source. The AVM controller may monitor the one or more sensor(s) on a continuous basis, per a predetermined schedule, or in response to a triggering event. The predetermined schedule may be based on a time interval of one hour, six hours, or 12 hours. Any time interval is possible. Further, the triggering event may correspond to receipt of an indication that at least one QoS parameter associated with signal data (i.e. voice and data communications) transmitted by the RF antennas has fallen below a predetermined QoS threshold. The QoS parameters may relate to data packet loss, data latency, jitter, echo, downlink throughput, uplink throughout, or any combination thereof. In some examples, the AVM controller may receive an indication of QoS parameters from an enterprise server of the telecommunications network or client device that is experiencing a reduction in QoS. Further, the predetermined thresholds may be set by an operator of the AVM controller or an administrator of the telecommunications network.

At 404, the AVM controller may quantify a voltage of the power transmission at the RRU, based at least in part on the voltage compensation tables. The AVM controller may receive an input of voltage output from the DC power source and, using the voltage compensation tables, output the voltage of the power transmission at the RRU. In some examples, the voltage compensation tables may be based on properties of the cables, such as cable length, cable resistance coefficient, and cable diameter.

At 406, the AVM controller may determine whether the voltage of the power transmission at the RRU is within a predetermined voltage range. The predetermined voltage range may be set by an operator of the AVM controller or telecommunications network, and further correspond to a voltage range required to maintain a QoS in voice and data communications via the RF antennas.

At 408, the AVM controller may determine that the voltage of the power transmission at the RRU is less than the predetermined voltage range. In doing so, the AVM controller may use voltage compensation tables to determine a voltage-boost that increases the voltage of the power transmission at the RRU to a voltage amount that is within the predetermined voltage range.

At 410, the AVM controller may generate and deploy a voltage modification control signal to a potential transformer that causes the potential transformer to step-up a voltage of the power transmission at the potential transformer to a voltage amount that is within the predetermined voltage range.

Figure 5:
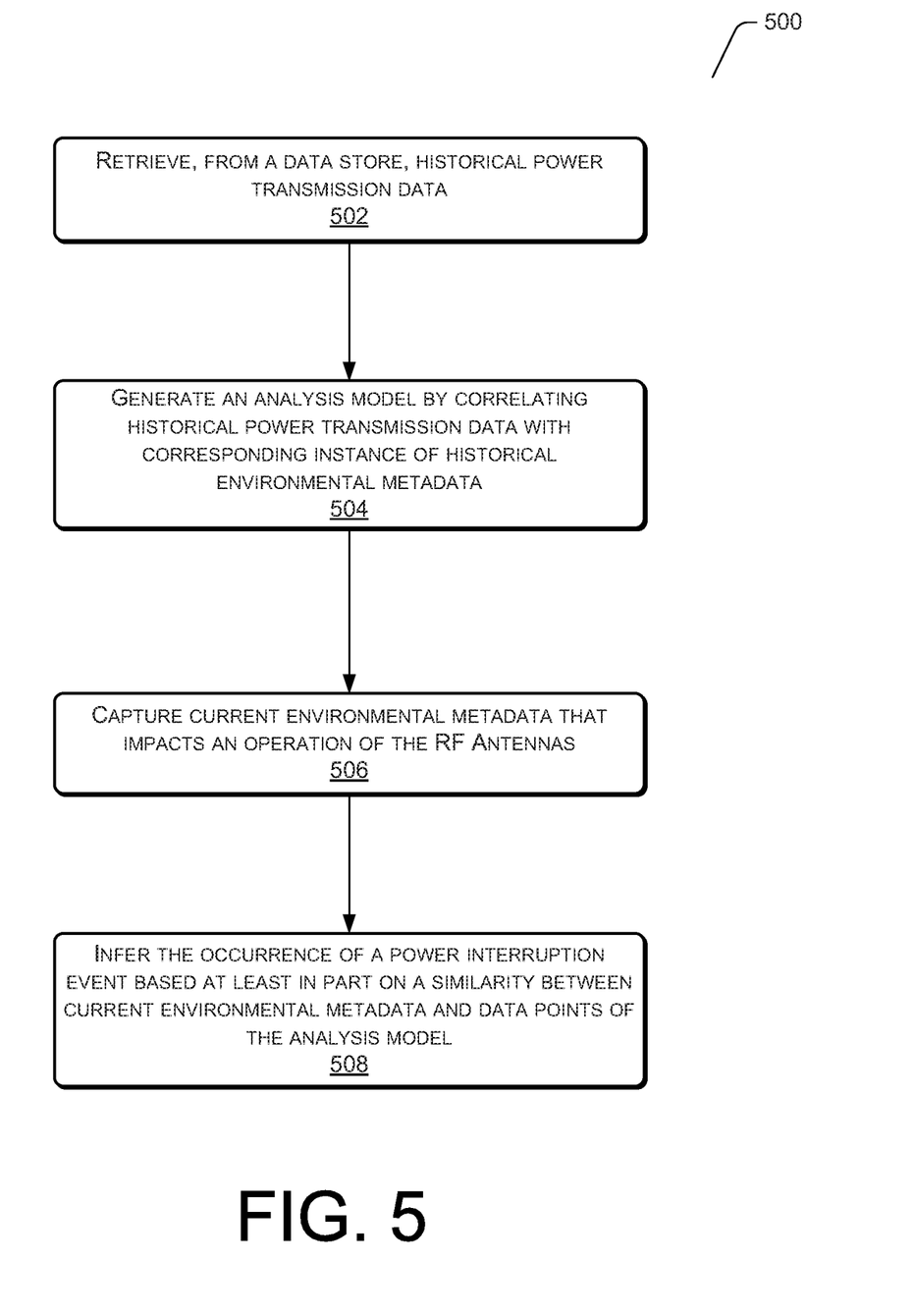
FIG. 5 illustrates an AVM controller process for generating an analysis model to preemptively infer power interruption events that may impact an operation of one or more RF antennas.

FIG. 5 illustrates an AVM controller process for generating an analysis model to preemptively infer power interruption events that impact QoS parameters associated with signal data (i.e. voice and data communications) transmitted by the RF antennas. The power interruptions may include a power disruption or a power surge, albeit due to network congestion, base-station hardware or base-station software failure.

At 502, the AVM controller may retrieve, from a data store, historical power transmission data associated with the DC power source, potential transformer, baseband unit, RRU, the RF antennas, or any combination thereof, over a predetermined time interval. The historical power transmission data may include periodic samplings of the voltage output from the DC power source, voltage loss that occurs during power transmissions to the RRU, voltage of power transmissions at the RRU, and corresponding QoS parameters of signal data (i.e. voice and data communications) transmitted by the RF antennas, or any combination thereof. The QoS parameters may relate to data packet loss, data latency, jitter, echo, downlink throughput, uplink throughout, or any combination thereof.

At 504, the AVM controller may generate an analysis model by correlating historical power transmission data with corresponding historical instances of environmental metadata. The historical environmental metadata may include periodic samplings of network congestion, network impediments (i.e. hardware or software-based), DC power source impediments, meteorological events, or any combination thereof. In some examples, historical environmental metadata may also include QoS parameters associated with the RF antennas at particular points in time.

At 506, the AVM controller may capture current environmental metadata that impacts an operation of the RF antennas. The AVM controller may retrieve the current environmental metadata from the DC power source, potential transformer, baseband unit, RRU, and the RF antennas, an enterprise server of the telecommunications network, or a trusted third-party server affiliated with, or accessible by, the AVM controller. In some examples, the current environmental metadata may include periodic samplings of network congestion, network impediments (i.e. hardware or software-based), DC power source impediments, meteorological events, or any combination thereof. The current environmental metadata may also include a calculation of, or pertinent data used to calculate, current QoS parameters associated with signal data (i.e. voice and data communications) transmitted by the RF antennas.

At 508, the AVM controller may determine a similarity between the current environmental metadata and data-points associated with the analysis model. In doing so, the AVM controller may infer the occurrence of a power interruption event based at least in part on the similarity being greater than or equal to a predetermined similarity threshold. The predetermined similarity threshold may be set by an operator of the AVM controller or an administrator of the telecommunications network.

Figure 6:
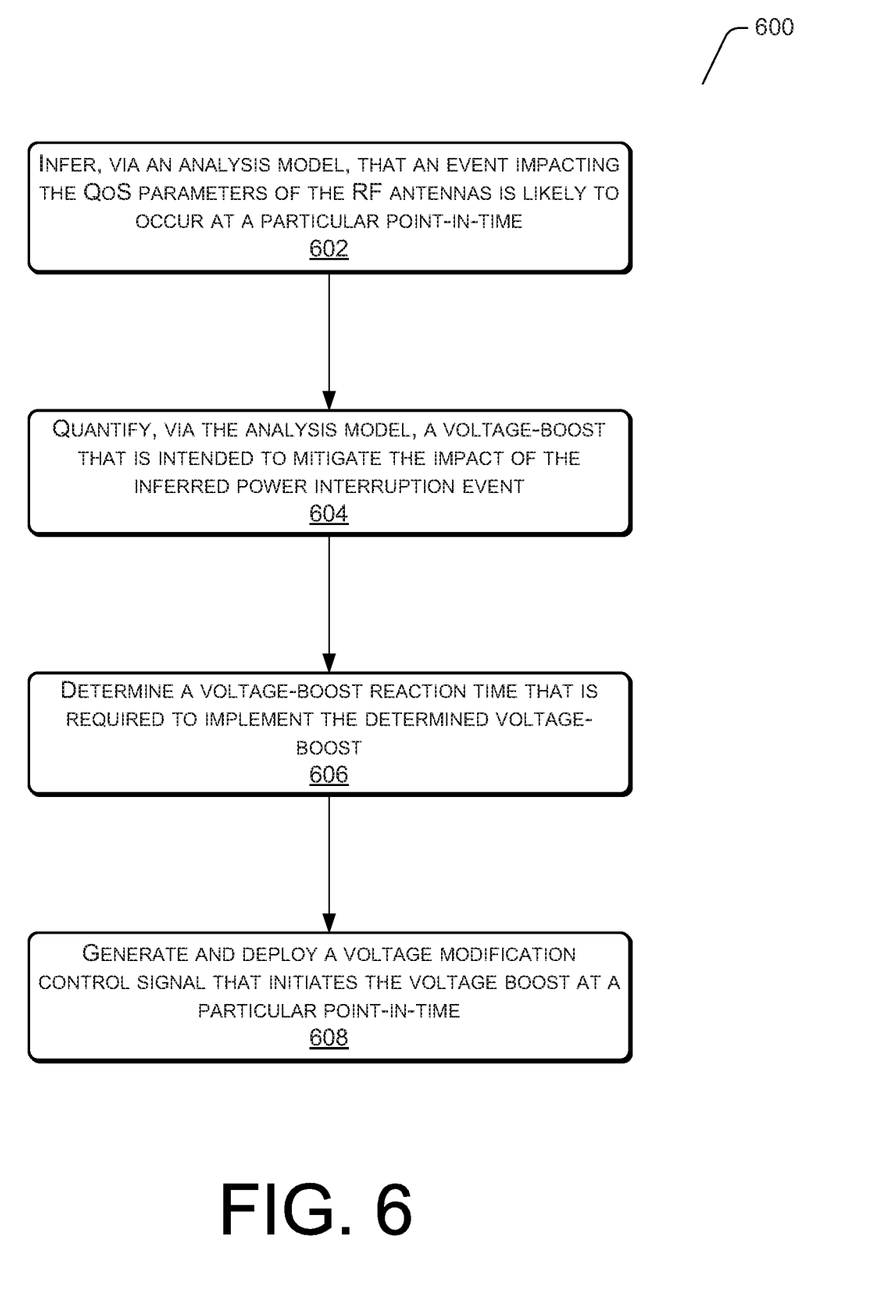
FIG. 6 illustrates an AVM controller process for initiating a voltage-boost at a point-in-time prior to an inferred power interruption event impacting an operation of one or more RF antennas.

FIG. 6 illustrates an AVM controller process for initiating a voltage-boost at a point-in-time prior to an inferred power interruption event impacting an operation of one or more RF antennas. In some examples, the inferred power interruption event may correspond to anticipated network congestion or a meteorological event.

At 602, the AVM controller may infer, via an analysis model, that an event impacting the QoS parameters of the RF antennas is likely to occur at a particular point-in-time. More specifically, the AVM controller may infer the occurrence of a power interruption event by employing one or more machine learning algorithms to correlate current environmental metadata with data-points of an analysis model.

At 604, the AVM controller may quantify, via the analysis model, a voltage-boost that is intended to mitigate the impact of the inferred power interruption event (i.e. network congestion or meteorological event). The voltage-boost may be further based at least in part on a voltage output of the DC power source.

At 606, the AVM controller may determine a voltage-boost reaction time, which quantifies an amount of time that is required to implement the determined voltage-boost. The voltage-boost reaction time may be based at least in part on a voltage step-up rate associated with the potential transformer that is coupled between the DC power source and the RRU.

At 608, the AVM controller may generate and deploy a voltage modification control signal to the potential transformer that causes the potential transformer to initiate the voltage-boost at a point-in-time that occurs prior to the inferred power interruption event by a time interval equal to or greater than the voltage-boost reaction time.

Figure 7:
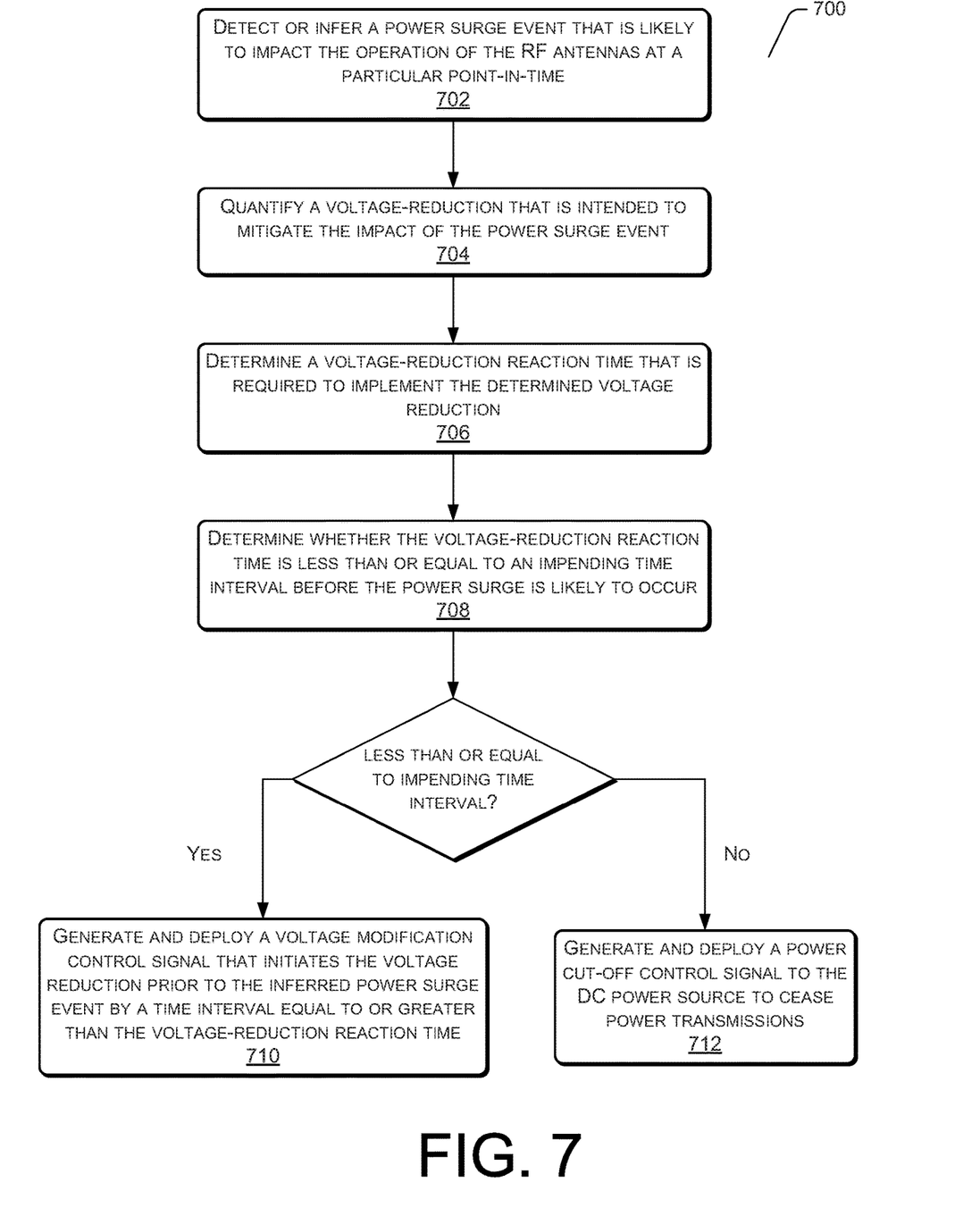
FIG. 7 illustrates an AVM controller process for selectively initiating a voltage-reduction of a power transmission at a Remote Radio Unit (RRU) to protect hardware and software elements from a power surge.

FIG. 7 illustrates an AVM controller process for selectively initiating a voltage-reduction of a power transmission at the RRU to protect hardware and software elements of the RRU and RF antennas from a power surge. The AVM controller may initiate the voltage-reduction at a point-in-time prior to an inferred power interruption event.

At 702, the AVM controller may detect or infer that a power surge event is likely to impact the QoS parameters of the RF antennas at a particular point-in-time. In one example, the AVM controller may detect a power surge, in real-time, from sensor data associated with one or more sensors positioned proximate to the DC power source, potential transformer, baseband unit, RRU, RF antennas, or any combination thereof. In another example, the AVM controller may infer, via an analysis model, that a power surge event impacting the RRU is likely to occur at a particular point-in-time, and in doing so, employ one or more machine learning algorithms to correlate current environmental metadata associated with the DC power source and the RRU with data-points of an analysis model.

At 704, the AVM controller may quantify a voltage-reduction that is intended to mitigate the impact of the power surge event based on the analysis model. In the event that the AVM controller detects a real-time power surge, the voltage-reduction may correspond to a difference between the voltage of the power surge and at least the upper limit of the predetermined voltage range.

At 706, the AVM controller may determine a voltage-reduction reaction time that is required to implement the determined voltage-reduction. The voltage-reduction reaction time may be based at least in part on a voltage step-down rate associated with the potential transformer that is coupled between the DC power source and the RRU.

At 708, the AVM controller may determine whether the voltage-reduction reaction time is less than or equal to an impending time interval before the power surge is likely to occur. In other words, the AVM controller may determine whether the power transmission at the RRU can be reduced to within the predetermined voltage threshold (i.e. below the upper-limit) before the power surge comes into effect. For example, consider an AVM controller that infers a power surge event is likely to occur in 15 minutes. The AVM controller may further determine that the voltage reduction that is required at the RRU is five volts and that the step-down voltage rate of the potential transformer is 0.5 volts-per-minute. In this example, the AVM controller may determine that the voltage-reduction reaction time is ten minutes, which is less than the time interval before the power surge is likely to occur (i.e. 15 minutes).

At 710, the AVM controller may determine that the voltage-reduction reaction time is less than or equal to an impending time interval before the power surge is likely to occur. In this example, the AVM controller may generate and deploy a voltage modification control signal to the potential transformer that causes the potential transformer to initiate the voltage-reduction at a point-in-time prior to an inferred power surge event. The point-in-time may precede the inferred power surge event by a time interval that is equal to or greater than the voltage-reduction reaction time.

At 712, the AVM controller may determine that the voltage-reduction reaction time is greater than an impending time interval before the inferred power surge is likely to occur. It is noteworthy that this step is implied for a real-time detection of a power surge. In this example, the AVM controller may transmit a power cut-off control signal to the DC power source. The power cut-off control signal may cause the DC power source to cease power transmissions. Doing so may protect the hardware and software elements of the power modification system, which includes the baseband unit, RRU, and RF antennas from any prospective or continued damage due to the power surge.

CONCLUSION

Although the subject matter has been described in language specific to features and methodological acts, it is to be understood that the subject matter defined in the appended claims is not necessarily limited to the specific features or acts described herein. Rather, the specific features and acts are disclosed as exemplary forms of implementing the claims.

The invention claimed is:

1. A system comprising:
one or more processors;
memory coupled to the one or more processors, the memory including one or more modules that are executable by the one or more processors to:
determine whether a first voltage of a power transmission at a Remote Radio Unit (RRU) is greater than or equal to a predetermined voltage threshold, the power transmission being sourced from a Direct Current (DC) power source that is coupled to the RRU;
in response to the first voltage being less than the predetermined voltage threshold, calculate a voltage boost that increases the first voltage to a second voltage, the second voltage being at least equal to the predetermined voltage threshold;
determine an incremental voltage boost that is required from a potential transformer over a predetermined time period to step up the first voltage to the second voltage;
generate a voltage modification control signal for transmission to the potential transformer, the voltage modification control signal to cause the potential transformer to initiate the incremental voltage boost, the incremental voltage boost being repeated at predetermined time intervals and for a predetermined number of cycles that is required to increase the first voltage at the RRU to the second voltage; and
transmit the voltage modification control signal to the potential transformer.

2. The system of claim 1, wherein the second voltage is associated with the power transmission at the DC power source, and wherein the one or more modules are further executable by the one or more processors to:
monitor, via one or more sensors, the first voltage at the RRU and the second voltage at the DC power source, and
wherein, to calculate the voltage boost corresponds to determining a difference between the first voltage and the second voltage.

3. The system of claim 1, wherein the one or more modules are further executable by the one or more processors to:
receive an indication of an external event that impacts a current operation of one or more RF antennas associated with the RRU; and
determine that an additional voltage boost is required to mitigate an impact to the current operation of the one or more RF antennas, based at least in part on the indication, and wherein to calculate the voltage boost further includes the additional voltage boost.

4. The system of claim 1, wherein the one or more modules are further executable by the one or more processors to:
retrieve, from a data-store, historical power transmission data associated with the DC power source and the RRU over a predetermined time interval; and
generate an analysis model associated with power transmissions from the DC power source to the RRU, based at least in part on the historical power transmission data, and
wherein, to calculate the voltage boost is further based at least in part on a correlation of the first voltage and the second voltage with data-points of the analysis model.

5. The system of claim 4, wherein the one or more modules are further executable by the one or more processors to:
retrieve, from the data-store, historical environmental metadata that corresponds to the historical power transmission data, and
wherein to generate the analysis model is further based at least in part on the historical environmental metadata.

6. The system of claim 1, wherein the one or more modules are further executable by the one or more processors to:
capture current environmental metadata associated with the DC power source and the RRU, and
wherein, to calculate the voltage boost is further based at least in part on the current environmental metadata.

7. The system of claim 1, wherein the one or more modules are further executable by the one or more processors to:
identify a step-up voltage rate that is associated with the potential transformer, the step-up voltage rate corresponding to an incremental voltage boost that occurs over a predetermined time period, and
wherein, to determine the incremental voltage boost is based at least in part on the step-up voltage rate.

8. The system of claim 1, wherein the one or more modules are further executable by the one or more processors to:
retrieve, from a data-store, historical voltage boost data associated with historical instances of operating the DC power source and the RRU; and
wherein, to calculate the voltage boost is based at least in part on the historical voltage boost data.

9. The system of claim 1, wherein the one or more modules are further executable by the one or more processors to:
determine a first voltage loss that occurs between the DC power source and the potential transformer and a second voltage loss that occurs between the potential transformer and the RRU, and
wherein to calculate the voltage boost is further based at least in part on the first voltage loss and the second voltage loss.

10. The system of claim 9, wherein to determine the first voltage loss and the second voltage loss is based at least in part on an electrical resistance of cables between the DC power source, the potential transformer, and the RRU.

11. The system of claim 9, wherein the first voltage loss and the second voltage loss are determined via one or more sensors at the DC power source, the potential transformer, and the RRU, the one or more sensors including a hall effect sensor that unobtrusively measures voltage in cables between the DC power source, the potential transformer, and the RRU.

12. A computer-implemented method, comprising:
under one or more processors:
monitoring, via one or more sensors, a first power transmission that is delivered from a Direct Current (DC) power source and a second power transmission that is delivered to a Remote Radio Unit (RRU) that is coupled to the DC power source;
analyzing sensor data from the one or more sensors to determine a first voltage of the first power transmission to a second voltage of the second power transmission;
determining that the first voltage is less than a predetermined voltage threshold that is to support the RRU;
calculating a voltage boost that increases the second voltage to at least the predetermined voltage threshold;
determining an incremental voltage boost that is required from a potential transformer over a predetermined time period to step up the first voltage to the second voltage;
generating a voltage modification control signal for transmission to the potential transformer that causes the potential transformer to initiate the incremental voltage, the incremental voltage boost being repeated at predetermined time intervals and for a predetermined number of cycles that is required to increase the first voltage to the second voltage; and
deploying the voltage modification control signal to the potential transformer.

13. The computer-implemented method of claim 12, further comprising:
capturing, current environmental metadata associated with the DC power source and the RRU, and
retrieving, from a data-store, historical power transmission data and corresponding historical environmental metadata that is associated with the DC power source and the RRU;
generating an analysis model associated with power transmissions from the DC power source to the RRU, based at least in part on the historical power transmission data and the corresponding historical environmental metadata; and
analyzing, via the analysis model, the current environmental metadata and the sensor data to calculate the voltage boost.

14. The computer-implemented method of claim 13, wherein the current environmental metadata further includes at least one of a current time of day or a current day of week, and
wherein, calculating the voltage boost via the analysis model is further based at least in part on the current time of day or the current day of week.

15. One or more non-transitory computer-readable media storing computer-executable instructions that, when executed on one or more processors, cause the one or more processors to perform acts comprising:
determining a first voltage of a power transmission at a Remote Radio Unit (RRU), the power transmission being delivered from a Direct Current (DC) power source that is coupled to the RRU;
determining that the first voltage is less than a predetermined voltage threshold, the predetermined voltage threshold corresponding to a power transmission threshold for operation of one or more RF antennas associated with the RRU;

calculating a voltage boost that increases the first voltage to a second voltage, the second voltage corresponding to at least the predetermined voltage threshold;

determining an incremental voltage boost that is required from a potential transformer over a predetermined time period to step up the first voltage to the second voltage; and generating and deploying a voltage modification control signal for transmission to the potential transformer, the voltage modification control signal to cause the potential transformer to initiate the incremental voltage boost, the incremental voltage boost being repeated at predetermined time intervals for a predetermined number of cycles that is required to increase the first voltage at the RRU to the second voltage.

16. The one or more non-transitory computer-readable media of claim 15, further storing instructions that perform acts comprising:

measuring, at the DC power source, an initial voltage of the power transmission from the DC power source;

retrieving, from a data-store, a voltage compensation table that correlates a voltage loss due to an electrical resistance of cables between the DC power source, the potential transformer, and the RRU; and calculating the first voltage at the RRU, based at least in part on the voltage compensation table and the initial voltage.

17. The one or more non-transitory computer-readable media of claim 15, further storing instructions to perform acts comprising:

capturing current environmental metadata associated with the DC power source and the RRU, the current environmental metadata including one or more indications of network congestion, network impediments, DC power source impediments, or meteorological events likely to impact a current operation of the one or more RF antennas;

retrieving, from a data-store, historical power transmission data and corresponding environmental metadata that is associated with the DC power source and the RRU; and generating an analysis model associated with power transmissions from the DC power source to the RRU, based at least in part on the historical power transmission data and the corresponding environmental metadata, and wherein, calculating the voltage boost is based at least in part on a correlation of the current environmental metadata and data-points of the analysis model.

18. The one or more non-transitory computer-readable media of claim 17, further storing instructions to perform acts comprising:

inferring that an inferred network congestion is likely to impact a future operation of the one or more RF antennas, based at least in part on the correlation of the current environmental metadata and the data-points of the analysis model;

determining an adjusted power transmission threshold for the RRU that accommodates the future operation of the one or more RF antennas during the inferred network congestion; and modifying the predetermined voltage threshold based at least in part on the adjusted power transmission threshold.

19. The one or more non-transitory computer-readable media of claim 18, further storing instructions to perform acts comprising:

identifying a step-up voltage rate that is associated with the potential transformer, the step-up voltage rate corresponding to an incremental voltage boost that occurs over a one-minute period; and determining a voltage boost reaction time that is required to increase the first voltage to the second voltage, based at least in part on the step-up voltage rate of the potential transformer, and wherein, the voltage modification control signal further initiates the voltage boost at the potential transformer at a point-in-time that occurs prior to the inferred network congestion by a time interval equal to or greater than the voltage boost reaction time.

20. The one or more non-transitory computer-readable media of claim 15, wherein the voltage boost is calculated to accommodate a first voltage loss due to an increase in power transmission requirements for operation of the one or more RF antennas, and a second voltage loss due to electrical resistance of cables between the DC power source, the potential transformer, and the RRU.

* * * * *